United States Patent
Worley

[19]

[11] Patent Number: 5,933,387
[45] Date of Patent: Aug. 3, 1999

[54] DIVIDED WORD LINE ARCHITECTURE FOR EMBEDDED MEMORIES USING MULTIPLE METAL LAYERS

[75] Inventor: Eugene Robert Worley, Irvine, Calif.

[73] Assignee: Richard Mann, Torrance, Calif.; a part interest

[21] Appl. No.: 09/050,190

[22] Filed: Mar. 30, 1998

[51] Int. Cl.⁶ ................................................. G11C 8/00
[52] U.S. Cl. ............................. 365/230.03; 365/189.08; 365/189.11; 365/230.08
[58] Field of Search ........................... 365/230.03, 233, 365/189.08, 189.11, 230.08

[56] References Cited

U.S. PATENT DOCUMENTS

| | | |
|---|---|---|
| Re. 32,993 | 7/1989 | Anami et al. . |
| Re. 33,280 | 7/1990 | Yoshimoto et al. . |
| 4,542,486 | 9/1985 | Anami et al. . |
| 4,554,646 | 11/1985 | Yoshimoto et al. . |
| 4,723,229 | 2/1988 | Hartgring et al. . |
| 5,748,547 | 5/1998 | Shau ................................. 365/230.03 |
| 5,764,590 | 6/1998 | Iwamoto et al. .................. 365/230.03 |
| 5,796,657 | 8/1998 | Lee et al. .......................... 365/230.03 |
| 5,798,973 | 8/1998 | Isa .................................... 365/230.03 |

*Primary Examiner*—David Nelms
*Assistant Examiner*—Hien Nguyen

[57] ABSTRACT

A semiconductor memory architecture is disclosed which results in reduced power dissipation. This reduction is accomplished by partitioning the word line of an array into segments thereby forming selectable blocks within the array. The power is reduced by the number of blocks by which the array can be partitioned. The word line segments are routed to a central decoder with a block select provision. Routing is accomplished with interconnect lines which are typically metal layers. The array remains continuous in spite of block partitioning.

4 Claims, 4 Drawing Sheets

DIVIDED WORD LINE ARCHITECTURE FOR EMBEDDED MEMORIES USING MULTIPLE METAL LAYERS

FIELD OF THE INVENTION

This invention is directed to lowering the power dissipation of semiconductor memories by organizing the memory into selectable blocks. The word lines within the block are routed to a central decoder using multiple metal lines. Semiconductor memories include static RAMs, ROMs, and Dynamic RAMs.

PRIOR ART

FIG. 1a shows a diagram of a conventional MOSFET based Static Random Access memory architecture. A plurality of memory cells are arranged in columns and rows. The Y address or row select data of the memory is typically decoded with the combination of a "NOR" gate and an inverter/driver, 107. The row line is referred to as the word fine 100 and it connects to the MOSFET gates of two select transistors 110, 111 as shown in FIG. 1b which is a schematic diagram of a standard six transistor SRAM cell 106. Since the gate is made of polysilicon the word line 100 is typically made of polysilicon as well. Six Transistor SRAM cells have two output or data lines, Bit 103 and Bit Bar 104.

In embedded memory applications where there are two or more levels of metal available the poly silicon word line is strapped with the second layer of metal 102 or metal 2 in order to reduce the word line delay due to the high resistance of the polysilicon word fine. As shown in FIG. 1a after the word line passes through some number of SRAM cells the poly word fine is strapped with metal 102 by a contact and a via 105. A space in the cell array is generally provided for the strap connection along with a metal 2 strap for the Vdd fine which is typically a P+ diffusion. With all word lines at Vss the entire array is de-selected.

Metal 1 runs in the column or "Y" direction and is used for bit lines 103, 104 and cell Vss. The two bit fines, bit 103 and bit bar 104, are connected to the drains of the memory cell's select transistors 110 and 111 of FIG. 1b.

The normal read sequence is to pre charge all bit lines such as 103 and 104 to a high voltage and then turn on a row of cells by elevating one of the word lines to the potential of Vdd or the potential of the positive power supply terminal. The selected row of cells then discharges half of all of the bit lines (either the bit or bit bar line is discharged depending on the state of the selected memory cell). Unfortunately, only a limited number of the bit line signals are accessed via the column decoder. For example, in a 512×512 array with a read word size of 8 bits, only 8 columns or 16 bit lines are accessed out of the 512 columns or 1024 bit lines. The discharge of half of all bit lines results in a large power dissipation since the capacitance per bit line is on the order of 1pF. To save power, it is desired that some practical means be found to limit the number of cells along a selected row which are not to be accessed from seeing the select word line signal.

It should be noted that the write operation also results in the discharge of half of all bit lines since the bit lines are also precharged before writing so that column cells not to be written along the selected row are not disturbed by improper conditioning of the bit lines.

It should also be noted that an alternate method to pre-charging the bit lines such as 103 and 104 to a positive potential is to have static loads on the bit lines which pull the lines up toward Vdd.

In U.S. Pat. Nos. 4,554,646, 4,542,486, 4,723,229 and revisions Re. 33,280 and Re. 32,993 a means is described to reduce the number of unselected cells along a row from seeing the row select or word line signal which, correspondingly, reduces the power required to read or write a memory array. FIG. 2 shows a diagram of said array. Note that the array is broken up into blocks 200a and 200b with a main word line 204 and a sub word line 205 which connects to the select transistors 110 and 111 of the cells in a block. Two input AND gates 202 are used to select the sub word line 205 within a block and are built into the row pitch of the array. One input of the AND gate 202 is connected to the main bit line and the other to a block select line 203. Thus, the sub word line selects a row of cells connected to it when a signal is present both on the main bit line 204 and the block select line 203. In conclusion, power is reduced in this scheme by turning on fewer cells along a row of cells (in this specific case, the array power in reduce by one halt). The penalty in using this scheme is increased RAM area due to the introduction of the AND gates 202 and the decoders for the block select lines 203.

The above method of saving power by organizing the array into to selectable blocks with sub word lines can also be applied to other types of MOSFET based memories including Read Only Memories (ROMs) and Dynamic Random Access Memories (DRAMs). The word line in both ROMs and DRAMs connects directly to the gates of select MOSFETs and is polysilicon as in the case of the SRAM. Also, the bit lines of ROMs and DRAMs are connected to the drains of said select MOSFETs and the bit lines are conditioned prior to reading. One condition that must be considered before applying the above method in a DRAM is refreshing which re-writes a whole row of cells during a read cycle and is critical to its data storage operation.

SUMMARY OF THE INSTANT INVENTION

It is the object of this invention to reduce the power dissipation of an embedded memory array by dividing the memory array into selectable blocks in the row direction by creating sub word lines using an approach different from that of the aforementioned prior art and with better layout efficiency. This is accomplished by routing the sub word lines using either side by side metal, or vertically stacked metal, or a combination thereof to a central row decoder.

DESCRIPTION OF THE PREFERRED EMBODIMENT

In modem CMOS processes Chemical Mechanical Polishing (CMP) in conjunction with tungsten (W) plugs is used to create flat surfaces for metal deposition. This technique has allowed many metal layers to be used in making an integrated circuit. It is not uncommon for CMOS processes with CMP to have 3, 4, 5 or even 6 levels of metal. This fact can be used to create block oriented memory arrays with sub-word lines in a more efficient manner than that of aforementioned prior art.

Figure 3:
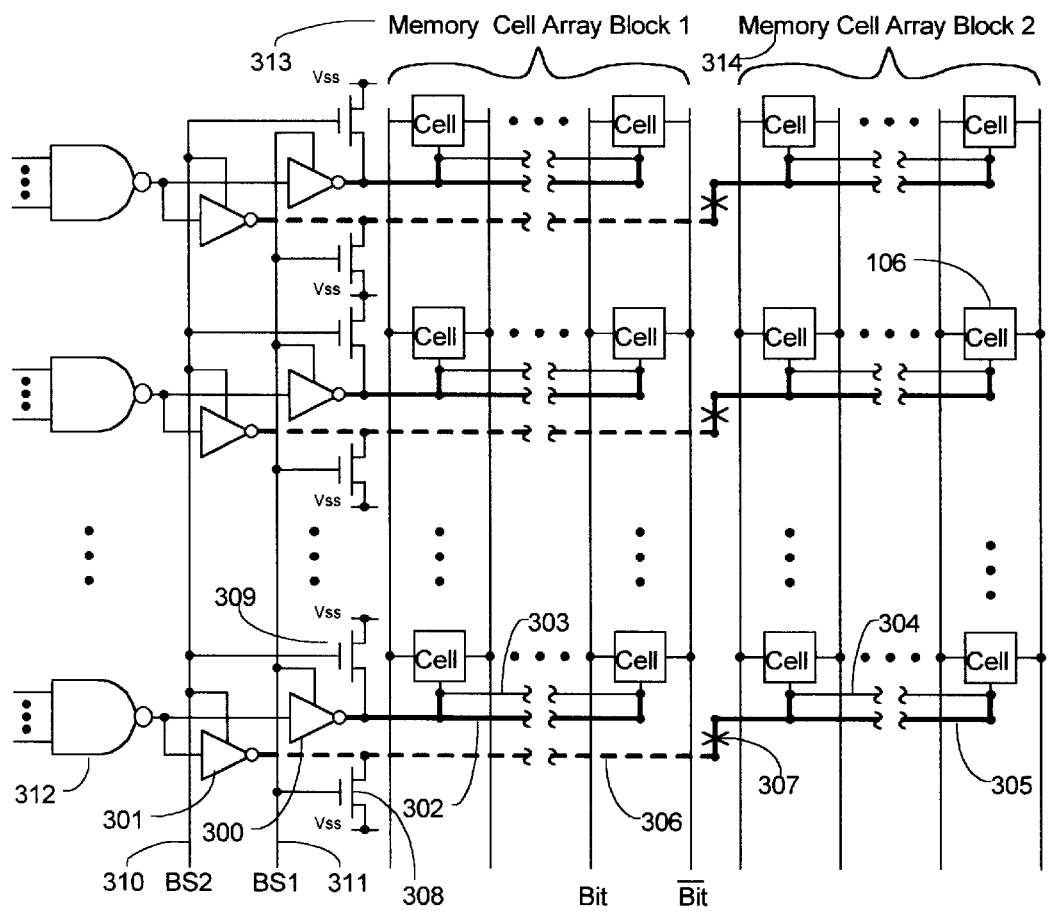
FIG. 3 is a schematic diagram of the improved method of row line segmentation using a central row decoder and interconnect lines to connect the decoder to the segmented word lines (2 are shown in this example).

FIG. 3 shows a diagram of the improved invention for the case in which there are 3 levels of metal. The word line inverter driver 108 of FIG. 1 has been divided into 2 inverters 300 and 301 each of which drive half of a row of cells. Inverter 300 drives the sub word line 302 of the block of cells 313 nearest the row decoder and the second inverter 301 drives the row of the block of cells 314 furthest from the row decoder. The poly word line 303 of the first block is strapped to the Metal 2 line 302 at appropriate points along the poly word line as in the case of FIG. 1. The poly word line 304 of the second block is correspondingly strapped by Metal 2 305 and is connected to Metal 3 306 which routes over the Metal 2 302 of the first block. Via 307 is used to connect the Metal 2 strap 305 of block 2 (314) with the Metal 3 line 306. In a CMP process the placement of the via 307 can be almost anywhere along the metal 2 strap 305 and does not require the cell array to be broken or to have a gap.

The block select/word line driver function is performed by a circuit described in U.S. Pat. No. 4,723,229. The central word line decoder is comprised on a high fan in NAND Gate 312 and two inverters, 300 and 301. The word line driver inverters 300 and 301 are adapted to perform what is in effect a NOR function so that either of the two word line inverters 300 and 301 can be disabled by the block select addresses 310 and 311. This function is in part created by applying or removing Vdd or the positive power to the inverters 300 and 301 via 310 and 311. BS1 311 is the Block Select 1 signal and BS2 310 is the Block Select 2 signal which is the compliment of BS1 311 during a read or write operation. To enable the word line 302 of block 1 the row decoder's NAND gate 312 must output a logic 0. If BS1 311 is high then inverter 300 is able to pull the word line 302 to Vdd thus enabling or selecting all of the cells along that word line in block 1. Meanwhile, BS2 310 remains at ground potential thus preventing word line 305 from going to Vdd from Vss.

The NFETs 308 and 309 connected to word lines 305 and 302 are used to hold the word lines low in the deselected state. Thus, these transistors 308 and 309 connect to the complimentary select signal. When BS1 311 is high BS2 310 is low which keeps NFET 309 "off" thus allowing word line 302 voltage to rise to Vdd and NFET 308 is "on" which maintains word line 305 in the low state. When both blocks are de-selected BS1 and BS2 can be held in the high logic state or Vdd thus forcing all word lines to Vss or ground.

Figure 1A:
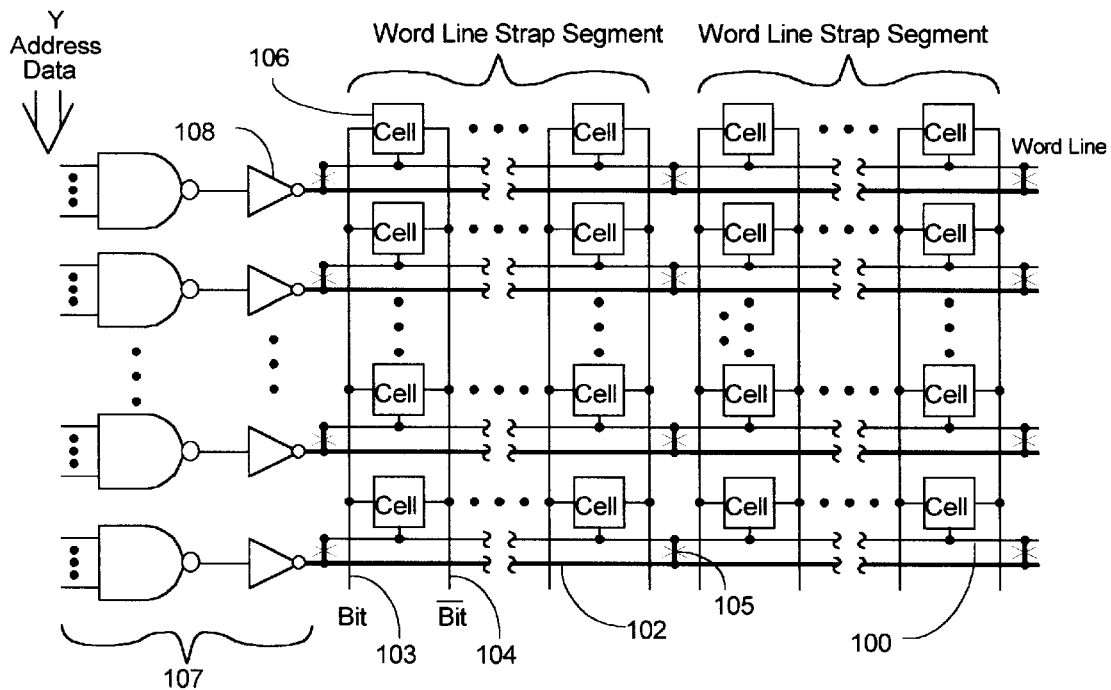
FIG. 1A is a schematic diagram of a conventional prior art SRAM array configuration.
Figure 1B:
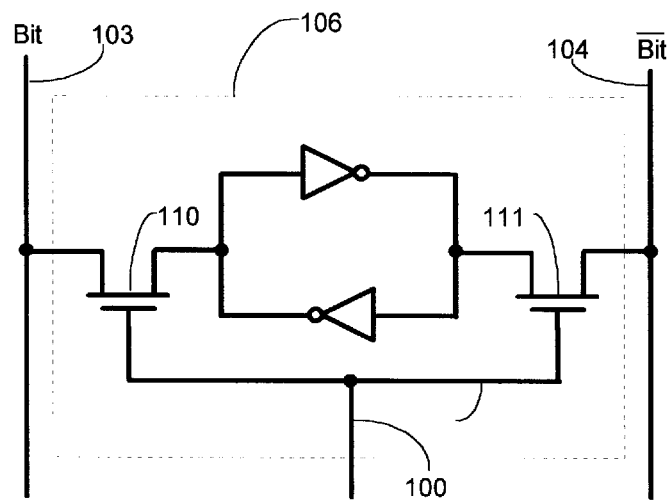
FIG. 1B is a schematic diagram of a conventional CMOS SRAM cell.
Figure 2:
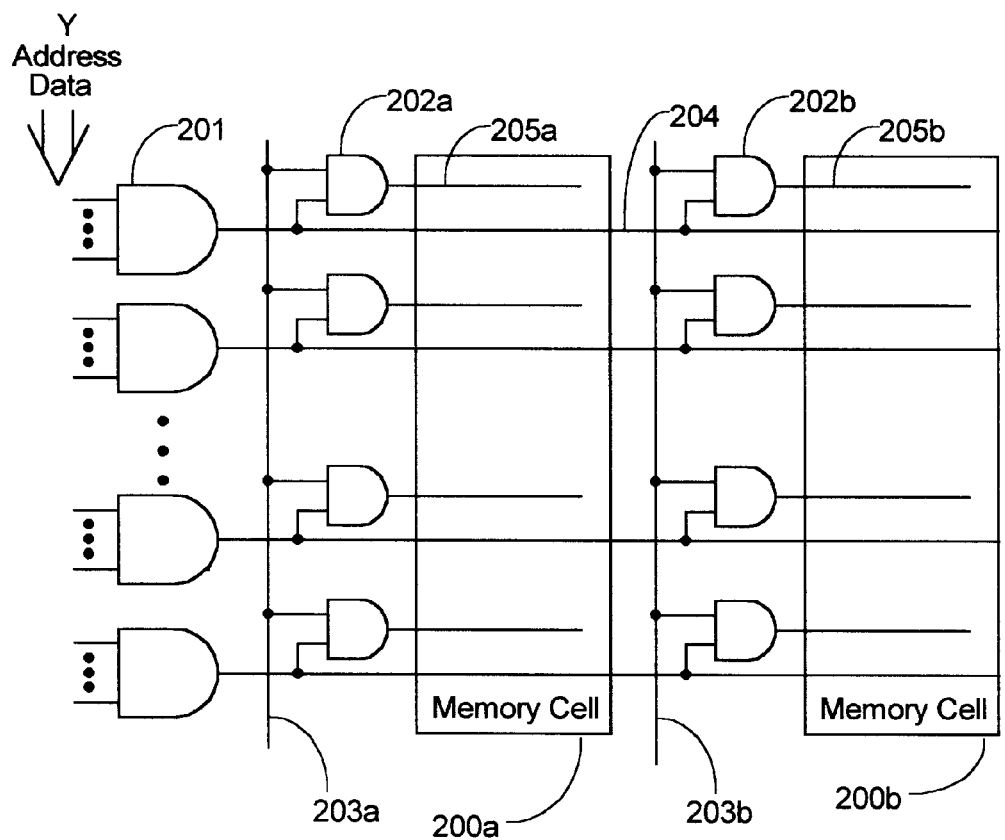
FIG. 2 is a schematic diagram of a prior art SRAM array organized into selectable blocks using segmented word lines in order to lower power.

The area requirements for the above partition of the row word line is relatively small. The cell array area is unchanged from the non partitioned array shown in FIG. 1. The driving inverter of the row decoder inverter 108 of FIG. 1 is partitioned into two inverters 300 and 301 with a small additional area being required for more interconnect. Also, pull down NFETs 308 and 309 have to be added to the row decoder circuit but can be made small since the inverter's NFET of 300 or 301 will provide for the rapid discharge of the word line after the data read or write operation. The block select lines 310 and 311 can be routed over the row decoder in metal 3. Additional circuitry is required in the periphery to drive the block select lines. The signal for the block select lines can come from one of the column address bits. The size of inverters 300 and 301 may be of slightly different sizes to compensate for the different word line capacitances of the two blocks so as to equalize the word line delay.

In should be pointed out that most semiconductor processes will allow line 306 to be routed in Metal 2 along with the Vdd metal strap and the word line strap 302 since three metal lines can easily fit into the SRAM cell's row pitch. Thus, a two block arrangement can be typically made as shown in FIG. 3 with only two levels of metal.

Figure 4:
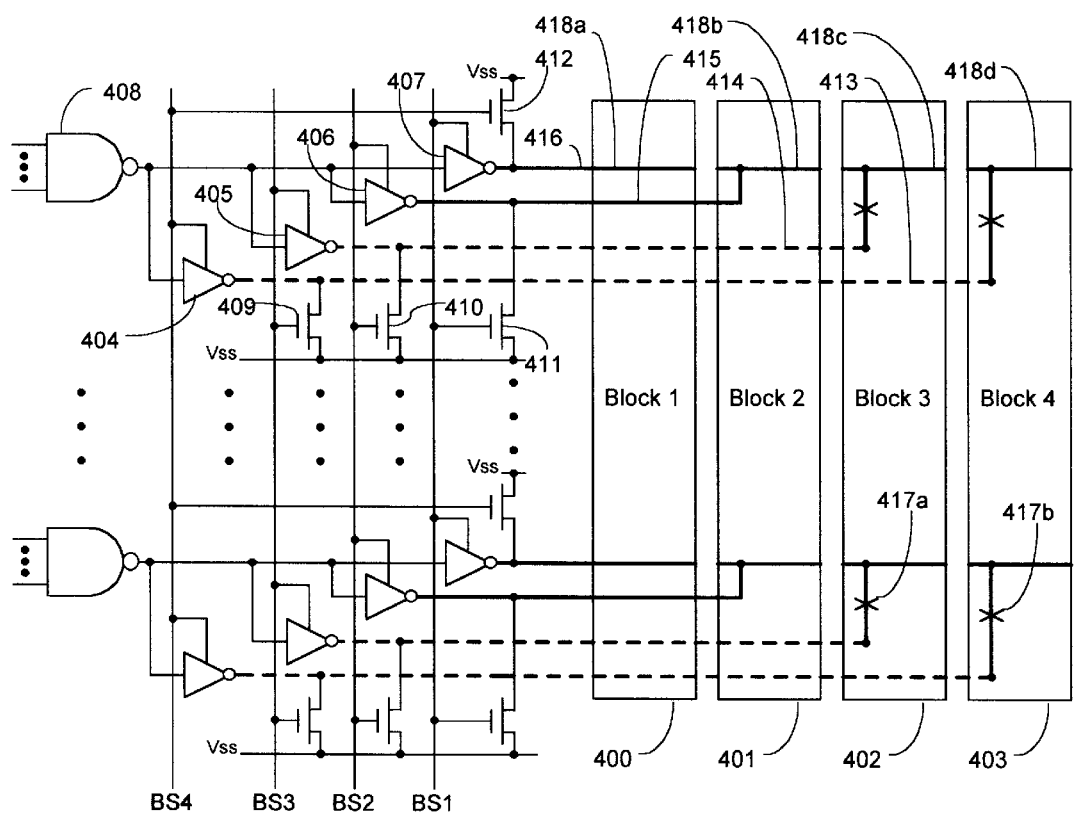
FIG. 4 is a schematic diagram of the improved method of row line segmentation showing an example of 4 segmented word lines.

FIG. 4 shows a diagram of an SRAM array with 4 selectable blocks with each block containing 4 polysilicon sub word lines 418a,418b, 418c and 418c, strapped with Metal 2. In this example the word line 418a of Block 400 is routed directly with the Metal 2 416 used to strap the poly sub word line. For Block 401 the connecting line 415 for word line 418b is routed over Block 400 in Metal 2 along side the Metal 2 word line strap of Block 400. For Block 402 the connecting line 414 for word line 418c is routed over Blocks 400 and 401 in Metal 3. Finally, for Block 403 the connecting line 413 for word line 418d is routed over Blocks 400, 401, and 402 in Metal 3 and runs along side connecting line 414 in Blocks 400 and 401. Via's 417a and 417b provide connections between the Metal 3 lines 413 and 414 and the Metal 2 word line straps 418c and 418d, respectively.

There are four word line inverter drivers 404, 405, 406, and 407 connected to the output of each row decoder NAND 408. There are also 4 NFET pull down devices 409, 410, 411, and 412 connected to each word line. The gate of any given NFET pull down device can be connected to any block select line other that the block select line associated with the inverter's output which is connected to said NFET's drain. This is possible since only one of the four block select lines can be selected at a time with the other three in the de-selected or ground state.

It can be appreciated that there are a number of metal line combinations that can be used to realize selectable blocks along a word line using the aforementioned method.

As mentioned previously, this word line block partitioning technique can also be applied to ROMs and DRAMs were there are sufficient layers of metal available in relation to the desired number of blocks in order to achieve lower array power dissipation. Because of the smaller row pitch of ROMs, the number of blocks that can be achieved relative to the number of metal layers is less than that of the SRAM array.

What is claimed:

1. An integrated circuit operating as a Random Access Memory comprising:

a plurality of blocks of memory cells with word lines for selecting a cell or group of cells within a block which constitute a logic word and bit lines for reading or writing a content of said cell or said group of cells within a block;

a central word line decoder used to select a row of cells within a block so that a group of cells or a word can be read or written based on a "Y" or row address input and a block select address input;

one or more levels of interconnect used to connect word lines of individual blocks to a central row decoder such that only the word line of a selected block is active during either a read or write operation.

2. The claim of 1 in which a plurality of word lines associated with a plurality of blocks is routed to the central row decoder either by a side by side metal interconnect, or vertically stacked metal interconnect, or a combination thereof which is available in a modern semiconductor logic process.

3. The claim of 1 in which there are a plurality of "NOR" gates corresponding in number to the plurality of blocks with one input of said "NOR" gate connecting to the output of a row decoder logic gate, the other input or inputs of said "NOR" gate connecting to one or more block enabling lines, and the output of said "NOR" gate connecting to one of the word lines of said plurality of blocks.

4. The claim of 3 in which the "NOR" gate is comprised of an inverter whose "Vdd" terminal is connected to a block enabling line, whose input is connected to the output of a row decoder logic gate, whose output is connected to a pull down NFET and to a word line of one of the plurality of blocks;

a pull down NFET whose drain is connected to the output of said inverter, whose gate is connected to a second block enabling line not connected to the "Vdd" or block enabling line of said inverter, and whose source is connected to Vss or ground.

\* \* \* \* \*